(12) United States Patent
Mikhaylichenko et al.

(10) Patent No.: US 7,067,016 B1
(45) Date of Patent: Jun. 27, 2006

(54) CHEMICALLY ASSISTED MECHANICAL CLEANING OF MRAM STRUCTURES

(75) Inventors: Katrina Mikhaylichenko, San Jose, CA (US); Michael Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 638 days.

(21) Appl. No.: 10/404,403

(22) Filed: Mar. 31, 2003

(51) Int. Cl.
*B08B 7/00* (2006.01)

(52) U.S. Cl. ............... 134/6; 134/26; 134/27; 134/29; 134/32; 134/33; 134/36; 134/42; 438/3; 438/745; 438/754; 438/906

(58) Field of Classification Search ............ 134/6, 134/26, 27, 29, 32, 33, 36, 42; 438/3, 745, 438/754, 906
See application file for complete search history.

(56) References Cited

U.S. PATENT DOCUMENTS

| | | | |
|---|---|---|---|
| 6,290,780 B1 * | 9/2001 | Ravkin | 134/6 |
| 6,439,245 B1 * | 8/2002 | Bliven et al. | 134/32 |
| 6,454,956 B1 * | 9/2002 | Engelhardt et al. | 216/53 |
| 6,711,775 B1 * | 3/2004 | Mikhaylich et al. | 15/77 |
| 6,733,596 B1 * | 5/2004 | Mikhaylichenko et al. | 134/6 |
| 6,759,263 B1 * | 7/2004 | Ying et al. | 438/48 |
| 6,759,339 B1 * | 7/2004 | Choi et al. | 438/710 |
| 6,821,907 B1 * | 11/2004 | Hwang et al. | 438/709 |
| 6,949,411 B1 * | 9/2005 | Mikhaylichenko et al. | 438/115 |
| 6,964,928 B1 * | 11/2005 | Ying et al. | 438/706 |
| 2001/0052351 A1 * | 12/2001 | Brown et al. | 134/2 |
| 2004/0040575 A1 * | 3/2004 | Tregub et al. | 134/6 |

* cited by examiner

Primary Examiner—M. Kornakov
(74) Attorney, Agent, or Firm—Martine Penilla & Gencarella, LLP (57) ABSTRACT

A method for post-etch cleaning of a substrate with MRAM structures and MJT structures and materials is disclosed. The method includes inserting the substrate into a first brush box configured for double-sided mechanical cleaning of the substrate. A non-HF, copper compatible chemistry is introduced into the first brush box for cleaning the active and backside surfaces of the substrate. The substrate is then inserted into a second brush box which is also configured to provide double-sided mechanical cleaning of the active and backside surfaces of the substrate. A burst of chemistry is introduced into the second brush box followed by a DIW rinse. The substrate is then processed through an SRD apparatus for final rinse and dry.

15 Claims, 3 Drawing Sheets

CHEMICALLY ASSISTED MECHANICAL CLEANING OF MRAM STRUCTURES

BACKGROUND OF THE INVENTION

1. Field of the Invention

The present invention relates generally to integrated circuit manufacturing, and more specifically to cleaning processes related to the manufacture of magnetic random access memory (MRAM) structures.

2. Description of the Related Art

Phase change non-volatile memory, such as MRAM and ferroelectric random access memory (FeRAM) is emerging as memory structures of choice in developing and next generation devices. MRAM can replace today's most common types of memory such as Flash, dynamic random access memory (DRAM), and static random access memory (SRAM). The benefits of MRAM with its small memory cells include write times down to approximately 2.3 nanoseconds, or approximately 1000 times faster than the fastest Flash memory, and 20 times faster than FeRAM. Additionally, MRAM access times are realized as fast as 3 nanoseconds which is approximately 20 times faster than DRAM. Typical MRAM implementations require only 2 milliamps, and consume less than one percent of the energy of comparable DRAM.

Plasma etch is one of the fabrication processes typically used in the manufacture of MRAM structures and circuits. As is well known, plasma etch involves a plurality of process steps including photoresist (PR) deposition, photolithography, etching, and post-etch PR strip. Often, undesirable process by-product and other residues remain on the surface of the wafer after all of the plasma etch process operations are completed. Typically, a post etch cleaning process such as wet bench cleaning is used to clean a wafer after an etching process and prior to the next fabrication process.

The composition of MRAM structures present particular problems to effective post-process cleaning. Specifically, MRAM includes multiple-tunnel junction (MJT) structures which are known to form and retain non-volatile residues on sidewalls as a result of the plasma etch process. The residues may present a severe problem for the next process step, and may dramatically reduce electrical yields. Sidewall residues, therefore, need to be removed prior to the next process step. MRAM MJT structures, however, present a complex problem for traditional wet clean approaches. Exposed copper lines are susceptible to corrosion, and the MJT structure is susceptible to galvanic cell formation between different MJT metals. Peeling, poor adhesion, and diffusion of metal species into dielectric are all adverse consequences of ineffective residue removal, and most significantly, decreased electrical yields.

In view of the foregoing, what is needed is a method and process of cleaning MRAM structures post-etch processing. Post-etch cleaning of MRAM structures should effectively remove sidewall residue without damage to MRAM structures, and should prevent or minimize copper corrosion and galvanic cell formation during the cleaning process.

SUMMARY OF THE INVENTION

Broadly speaking, the present invention fills these needs by providing a method for chemically assisted mechanical cleaning of substrates having MRAM structures defined therein. The present invention can be implemented in numerous ways, including as a process, an apparatus, a system, a device, a method, or a computer readable media. Several embodiments of the present invention are described below.

In one embodiment, a method for post-etch cleaning of a substrate having magnetic random access memory (MRAM) structures defined therein is provided. The method includes providing a substrate having MRAM structures being fabricated thereon. The MRAM structures include multiple-tunnel junction (MJT) structures and materials. A substrate is inserted into a first brush box. The first brush box is configured to provide double-sided mechanical cleaning of an active and a backside surface of the substrate. A first brush is applied against the active surface of the substrate, and a second brush is applied against the backside surface of the substrate. The first brush and the second brush are PVA brushes having nodules and are applied at a pressure to achieve brush compression between approximately 1–5 mm. The method then provides for introducing a copper compatible chemistry into the first brush box for cleaning the active and backside surfaces of the substrate. Next, the substrate is inserted into a second brush box. The second brush box is configured to provide double-sided mechanical cleaning of the active and backside surfaces of the substrate. The method provides for applying a first brush of the second brush box against the active surface of the substrate, and applying a second brush of the second brush box against the backside surface of the substrate. The first brush of the second brush box and the second brush of the second brush box are PVA brushes having nodules, and are applied at a pressure to achieve a brush compression between approximately 1 and 5 mm. The method then provides for introducing a burst of chemistry into the second brush box, and introducing a deionized water (DIW) rinse into the second brush box.

In another embodiment, a method for chemically assisted mechanical cleaning of magnetic random access memory (MRAM) structures is provided. The method includes providing a substrate having MRAM structures being fabricated thereon. The MRAM structures include multiple-tunnel junction (MJT) structures and materials, and the substrate has an active surface and a backside surface. The method then includes inserting the substrate into a first brush box having a pair of brushes to provide double-sided mechanical cleaning of the active and backside surfaces of the substrate. A copper compatible chemistry is introduced into the first brush box for cleaning the active and backside surfaces of the substrate. Next, the method provides for inserting the substrate into a second brush box having a pair of brushes to provide double-sided mechanical cleaning of the active and backside surfaces of the substrate where deionized water (DIW) rinse is introduced. Each of the pair of brushes in the first brush box and in the second brush box is a PVA brush with nodules, and each of the pair of brushes applied against the active and the backside surfaces of the substrate are applied at a pressure to achieve a brush compression of between approximately 1 and 5 mm.

In a further embodiment, a method for post-etch, chemically assisted mechanical cleaning of magnetic random access memory (MRAM) structures is provided. The method includes providing a substrate having MRAM structures being fabricated thereon. The MRAM structures include multiple-tunnel junction (MJT) structures and materials, and the substrate has an active surface and a backside surface. The method calls for inserting the substrate into a first brush box that has a pair of brushes to provide double-sided mechanical cleaning of the active and backside surfaces of the substrate. Then, a deionized water (DIW)

solution is introduced into the first brush box for cleaning the active and backside surfaces of the substrate. The method then provides for inserting the substrate into a second brush box that has a pair of brushes to provide double-sided mechanical cleaning of the active and backside surfaces of the substrate. A deionized water (DIW) rinse is introduced into the second brush box. Each of the pair of brushes in the first brush box and in the second brush box is a PVA brush with nodules, and each of the pair of brushes is applied against the active and the backside surfaces of the substrate at a pressure to achieve a brush compression of between approximately 1 and 5 mm.

In yet another embodiment, a method for post-etch cleaning of a substrate having magnetic random access memory (MRAM) structures defined therein is provided. The method includes providing a substrate having MRAM structures being fabricated thereon. The MRAM structures include multiple-tunnel junction (MJT) structures and materials. The substrate is inserted into a brush box which is configured to provide double-sided mechanical cleaning of an active and a backside surface of the substrate. A first brush is applied against the active surface of the substrate, a second brush is applied against the backside surface of the substrate. The first brush and the second brush are PVA brushes having nodules, and are applied at a pressure to achieve brush compression between approximately 1–5 mm. The method provides for introducing a copper compatible chemistry into the first brush box for cleaning the active and backside surfaces of the substrate. Then, the substrate is inserted into a drying apparatus for final rinse and dry.

The advantages of the present invention over the prior art are numerous. One notable benefit and advantage of the invention is safe and effective cleaning of sidewall residues in MRAM structures produced as a result of an etching process. Brush scrubbing is a widely used technology recognized for its ability to remove particles and residues from planar surfaces. Embodiments of the present invention provide chemically assisted brush scrubbing of MRAM structures that provide effective cleaning while avoiding damage to patterned features. Further, embodiments of the present invention are also safe and effective for use with delicate or fragile low-k dielectrics.

Another benefit is in reduced cost of ownership for installed base fabrication tools. Expensive wet bench cleaning apparatus is ineffective and inappropriate for post-etch MRAM manufacturing processes, and embodiments of the present invention implement use of brush box scrubbing units found to be both safe and effective for MRAM applications.

An additional benefit is the flexibility of embodiments of the present invention in the use of chemistries for chemically assisted mechanical cleaning, which can be tailored to specific applications.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

An invention for post-etch cleaning of MRAM structures is described. In preferred embodiments, methods for post-etch cleaning of MRAM structures include brush box scrubbing of substrates having MRAM structures being fabricated therein. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As an overview, embodiments of the present invention provide methods for post-etch cleaning of wafers having MRAM structures. Due to the composition of MRAM MJT structures, traditional post-etch wet cleaning methods such as wet-bench processes are ineffective or inappropriate. By way of example, etching operations produce non-volatile compounds in and on MJT structures which remain as sidewall residues post-etch. Typical wet bench cleaning processes are generally ineffective in the removal of residues. Further, MRAM structures include copper wiring which is particularly susceptible to corrosion in the wet bench environment. Because MRAM structures have defined features (as opposed to a featureless, planar surface), and are often fabricated on a low-k dielectric substrate, mechanical cleaning such as scrubbing has been considered inappropriate as likely to damage topography, as well as likely to cause damage to delicate or fragile low-k dielectrics. Embodiments of the present invention provide a mechanically-assisted wet cleaning process found to be safe for use with MRAM structures and low-k dielectrics, as well as effective in the removal of sidewall residues.

Double sided brush scrubbing of wafers having MRAM structures can be used effectively for post-etch cleaning with no damage induced by mechanical force. In general, embodiments of the present invention use double sided brush scrubbing to remove unwanted materials such as PR residues, polymers, particles, etc., from the front or active and backside surfaces of a wafer. Chemical and mechanical actions are combined to provide maximum cleaning efficiency without damaging the topography of etched MRAM structures or the fragile low-k dielectric films and substrates. Further, the use of deionized water (DIW) and/or copper compatible chemistry removes unwanted and undesirable residues and prevents damage and corrosion of copper wires and other copper surfaces.

Figure 1:
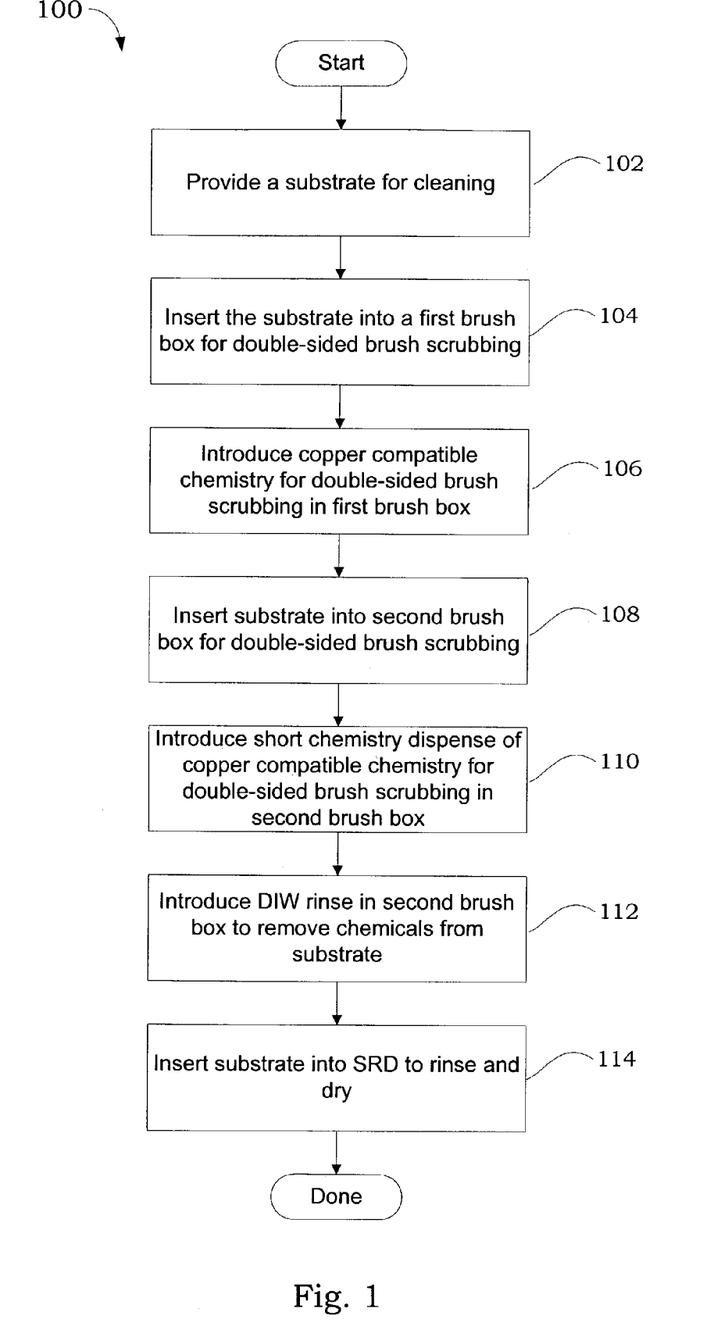
FIG. 1 is a flow chart diagram illustrating the method operations for chemical mechanical removal of post etch residues on MRAM structures in accordance with one embodiment of the present invention.

FIG. 1 is a flow chart diagram 100 illustrating the method operations for chemical mechanical removal of post etch residues on MRAM structures in accordance with one embodiment of the present invention. The method begins with operation 102 in which a substrate is provided for post-etch cleaning. In one embodiment, the substrate is a wafer having a low-k dielectric substrate having MRAM structures and materials with features etched therein. MRAM structures and materials include MJT structures and materials, and the features etched therein present a topography that is generally not uniformly smooth and planar.

The method continues with operation 104 in which the substrate is inserted into a first brush box for double-sided scrubbing. Double-sided scrubbing includes the mechanical cleaning of both the active and the backside surfaces of the substrate. The brush box can be any type of brush box scrubber typically used in semiconductor manufacturing. Exemplary brush box scrubbers include the brush box described in U.S. Pat. No. 5,875,507, and the brush box described in co-pending U.S. patent application Ser. No. 10/185,306, filed on Jun. 27, 2002, and assigned to the same assignee as the present application. The brush box scrubber can be of a type configured to process a substrate in a vertical orientation, in a horizontal orientation, or any other orientation in accordance with the particular brush box used. Chemistries, rinsing agents, or other fluids can be introduced through the brushes, against the substrate surfaces, over the brush surfaces, or in any other manner compatible and consistent with the brush box used. In one embodiment, the substrates are introduced into the first brush box by way of an input station that provides rinsing or wetting of a substrate prior to insertion into the first brush box scrubber. In another embodiment, a "dry" input station is used without a dedicated pre-scrub rinsing or wetting process.

The method continues with operation 106 in which a copper compatible chemistry is introduced for double-sided brush scrubbing in the first brush box. In one embodiment, a non-HF chemistry is selected in order not to damage MJT materials. In one embodiment, the copper compatible chemistry is a buffered chemical mixture containing a chelating agent. An exemplary chemistry is MCC2500 or MCC2500P available from Ashland. In one embodiment, the chemistry selected is an ammonia based buffered solution having a chelating agent.

The copper compatible chemistry is introduced into the first brush box for double-sided brush scrubbing in operation 106. The chemistry can be introduced through the brush, against the wafer surfaces, over the brush, and/or in any manner compatible and consistent with the type of brushes and brush box used. The introduction of the copper compatible chemistry is introduced into the first brush box for double-sided brush scrubbing immediately prior to and during double-sided brush scrubbing of the substrate, or in any manner compatible and consistent with the brush box used. In one embodiment, the copper compatible chemistry is introduced into the first brush box for double-sided brush scrubbing at a flow rate in the range of approximately 100 ml/min. to approximately 1000 ml/min.

In one embodiment, the substrate is rotated during double-sided brush scrubbing in a range of approximately 10 RPM to approximately 200 RPM. In one embodiment, the substrate is rotated during double-sided brush scrubbing at approximately 20 RPM.

In one embodiment of the invention, as the copper compatible chemistry is introduced for and during double-sided brush scrubbing of the substrate, the brushes are rotated and applied against both the active and backside surfaces of the substrate. The resulting chemically assisted mechanical cleaning of the substrate effectively removes post-etch sidewall residues, polymers, particles, etc., from the etched MRAM features without damaging MRAM structures, features, or a low-k dielectric film. In one embodiment, the brushes used are standard PVA brushes having nodules. The brushes are applied against the active and backside surfaces of the substrate at a pressure sufficient to achieve a brush compression in the range of approximately 1–5 mm.

In one embodiment, the brushes are rotated at a rotation rate in the range of approximately 10 RPM to approximately 400 RPM. In one embodiment, the brushes are rotated at approximately 120 RPM while scrubbing the active and backside surfaces of the substrate in the first brush box. In one embodiment, the substrate is scrubbed in the first brush box for a duration in the range of approximately 20 seconds to approximately 80 seconds. In one embodiment, the substrate is scrubbed in the first brush box for approximately 40 seconds.

Following the introduction of copper compatible chemistry and the double-sided brush scrubbing in the first brush box of operation 106, the method continues with operation 108 in which the substrate is inserted into a second brush box for double-sided brush scrubbing. The second brush box, in one embodiment, is essentially of the same type and structure as the first brush box. In another embodiment, a substrate is processed in one brush box only.

In operation 110, copper compatible chemistry is introduced in a short-chemistry dispensing manner. In one embodiment, short-chemistry dispense, also referred to as a burst dispense, includes introduction of chemistry for approximately three seconds, applied through the brushes, over the brushes, over the brushes and against the surfaces of the substrate, or in any other manner consistent and compatible with the brush box used. In one embodiment, the chemistry selected is essentially the same chemistry used in the first brush box and described above in reference to operation 106. In another embodiment, the chemistry is a diluted form of essentially the same chemistry used in the first brush box and described above.

The method then continues with operation 112 in which deionized water (DIW) is introduced into the second brush box to rinse and remove chemicals from the substrate. In one embodiment, DIW is introduced at not less than 500 ml/min. In one embodiment, DIW is introduced at approximately two liters/min. DIW is introduced through the brushes, over the brushes, against the surfaces of the substrate, or in any manner consistent and compatible with the brushes and brush box used.

In one embodiment, the substrate is scrubbed in operations 110 and 112 in essentially the same manner as described above for operation 106. The brushes are, in one embodiment, standard PVA brushes with nodules, applied against the active and backside surfaces of the substrate at sufficient pressure to achieve a brush compression of approximately 1–5 mm, and rotating at a rate in a range of approximately 10 RPM to approximately 400 RPM, and in one embodiment rotating at approximately 120 RPM. In one embodiment, the substrate is rotated at a rate in a range of approximately 10–200 RPM, and in one embodiment the substrate is rotated at approximately 20 RPM. In one embodiment, the scrubbing of the substrate in the second brush box with the short or burst chemistry dispense and the DIW rinse described in operations 110 and 112 is for a duration in a range of approximately 20 seconds to approximately 80 seconds, and in one embodiment for approximately 40 seconds.

The method concludes with operation 114 in which the substrate is inserted into a spin-rinse-dry (SRD) apparatus for final rinsing and drying following the second brush box scrubbing described in reference to operations 110 and 112. The SRD apparatus can be any type of SRD apparatus commonly used in semiconductor manufacturing. Exemplary SRD apparatus include the SRD apparatus described in U.S. Pat. No. 5,778,554, and an SRD apparatus using a surface tension reducing process as described in co-pending U.S. patent application Ser. No. 10/151,664, filed on May 17, 2002, and assigned to the same assignee as the present application. In another embodiment, a drying apparatus other than an SRD is used. With the final rinse and dry of the substrate in operation 114, the method is done.

Figure 2:
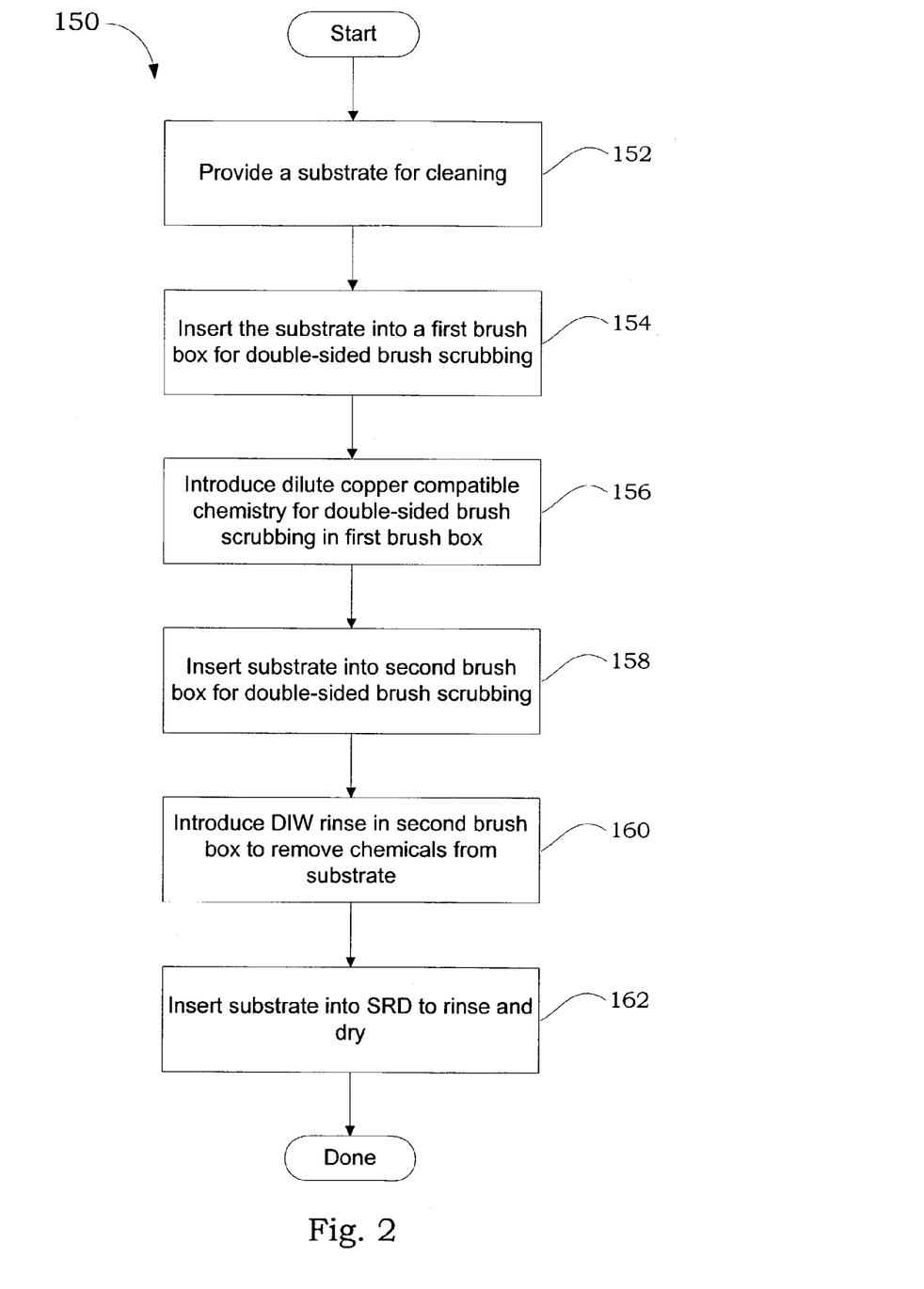
FIG. 2 is a flow chart diagram illustrating the method operations for chemical mechanical removal of post etch residues on MRAM structures in accordance with another embodiment of the present invention.

FIG. 2 is a flow chart diagram 150 illustrating the method operations for chemical mechanical removal of post etch residues on MRAM structures in accordance with another embodiment of the present invention. The method begins with operation 152 in which a substrate is provided for post-etch cleaning. In one embodiment, the substrate is a wafer having a low-k dielectric substrate having MRAM structures and materials with features etched therein. MRAM structures and materials include MJT structures and materials, and the features etched therein present a topography that is generally not uniformly smooth and planar.

The method continues with operation 154 in which the substrate is inserted into a first brush box for double-sided scrubbing. Double-sided scrubbing includes the mechanical cleaning of both the active and the backside surfaces of the substrate. The brush box can be any type of brush box scrubber typically used in semiconductor manufacturing. Exemplary brush box scrubbers include the brush box described in U.S. Pat. No. 5,875,507, and the brush box described in co-pending U.S. patent application Ser. No. 10/185,306, filed on Jun. 27, 2002, and assigned to the same assignee as the present application. The brush box scrubber can be of a type configured to process a substrate in a vertical orientation, in a horizontal orientation, or any other orientation in accordance with the particular brush box used. Chemistries, rinsing agents, or other fluids can be introduced through the brushes, against the substrate surfaces, over the brush surfaces, or in any other manner compatible and consistent with the brush box used. In one embodiment, the substrates are introduced into the first brush box by way of an input station that provides rinsing or wetting of a substrate prior to insertion into the first brush box scrubber. In another embodiment, a "dry" input station is used without a dedicated pre-scrub rinsing or wetting process.

The method continues with operation 156 in which a dilute copper compatible chemistry is introduced for double-sided brush scrubbing in the first brush box. In one embodiment, a non-HF chemistry is selected in order not to damage MJT materials, and in operation 156, the chemistry is a diluted form of essentially the same chemistry described above in reference to operation 106 of flow chart 100. In another embodiment, the chemistry is not dilute, but rather full strength. In one embodiment, the copper compatible chemistry is a buffered chemical mixture containing a chelating agent. An exemplary chemistry is MCC2500 or MCC2500P available from Ashland. In one embodiment, the chemistry selected is an ammonia based buffered solution having a chelating agent.

The dilute copper compatible chemistry is introduced into the first brush box for double-sided brush scrubbing in operation 156. The chemistry can be introduced through the brush, against the wafer surfaces, over the brush, and/or in any manner compatible and consistent with the type of brushes and brush box used. The introduction of the copper compatible chemistry is introduced into the first brush box for double-sided brush scrubbing immediately prior to and during double-sided brush scrubbing of the substrate, or in any manner compatible and consistent with the brush box used. In one embodiment, the dilute copper compatible chemistry is introduced into the first brush box for double-sided brush scrubbing at a flow rate in the range of approximately 100 ml/min. to approximately 1000 ml/min.

In one embodiment, the substrate is rotated during double-sided brush scrubbing in a range of approximately 10 RPM to approximately 200 RPM. In one embodiment, the substrate is rotated during double-sided brush scrubbing at approximately 20 RPM.

In one embodiment of the invention, as the dilute copper compatible chemistry is introduced for and during double-sided brush scrubbing of the substrate, the brushes are rotated and applied against both the active and backside surfaces of the substrate. The resulting chemically assisted mechanical cleaning of the substrate effectively removes post-etch sidewall residues, polymers, particles, etc., from the etched MRAM features without damage to the MRAM structures and features or a low-k dielectric substrate. In one embodiment, the brushes used are standard PVA brushes having nodules. The brushes are applied against the active and backside surfaces of the substrate at a pressure sufficient to achieve a brush compression in the range of approximately 1–5 mm.

In one embodiment, the brushes are rotated at a rotation rate in the range of approximately 10 RPM to approximately 400 RPM. In one embodiment, the brushes are rotated at approximately 120 RPM while scrubbing the active and backside surfaces of the substrate in the first brush box. In one embodiment, the substrate is scrubbed in the first brush box for a duration in the range of approximately 20 seconds to approximately 80 seconds. In one embodiment, the substrate is scrubbed in the first brush box for approximately 40 seconds.

Following the introduction of the dilute copper compatible chemistry and the double-sided brush scrubbing in the first brush box of operation 156, the method continues with operation 158 in which the substrate is inserted into a second brush box for double-sided brush scrubbing. The second brush box, in one embodiment, is essentially of the same type and structure as the first brush box. In one embodiment, the substrate is processed in one brush box only.

In operation 160, deionized water (DIW) is introduced into the second brush box to rinse and remove chemicals from the substrate. In one embodiment, DIW is introduced at not less than 500 ml/min. In one embodiment, DIW is introduced at approximately two liters/min.

In one embodiment, the substrate is scrubbed in operation 160 in essentially the same manner as described above for operation 156. The brushes are, in one embodiment, standard PVA brushes with nodules, applied against the active and backside surfaces of the substrate at sufficient pressure to achieve a brush compression of approximately 1–5 mm, and rotating at a rate in a range of approximately 10 RPM to approximately 400 RPM, and in one embodiment at approximately 120 RPM. In one embodiment, the substrate is rotated at a rate in a range of approximately 10–200 RPM, and in one embodiment the substrate is rotated at approximately 20 RPM. In one embodiment, the scrubbing of the substrate in the second brush box with the DIW rinse described in operation 160 is for a duration in a range of approximately 20 seconds to approximately 80 seconds, and in one embodiment for approximately 40 seconds.

The method concludes with operation 162 in which the substrate is inserted into a spin-rinse-dry (SRD) apparatus for final rinsing and drying following the second brush box scrubbing. The SRD apparatus can be any type of SRD apparatus commonly used in semiconductor manufacturing. Exemplary SRD apparatus include the SRD apparatus described in U.S. Pat. No. 5,778,554, and an SRD apparatus using a surface tension reducing process as described in co-pending U.S. patent application Ser. No. 10/151,664, filed on May 17, 2002, and assigned to the same assignee as the present application. In one embodiment, a drying apparatus other than an SRD apparatus is used. With the final rinse and dry of the substrate in operation 162, the method is done.

Figure 3:
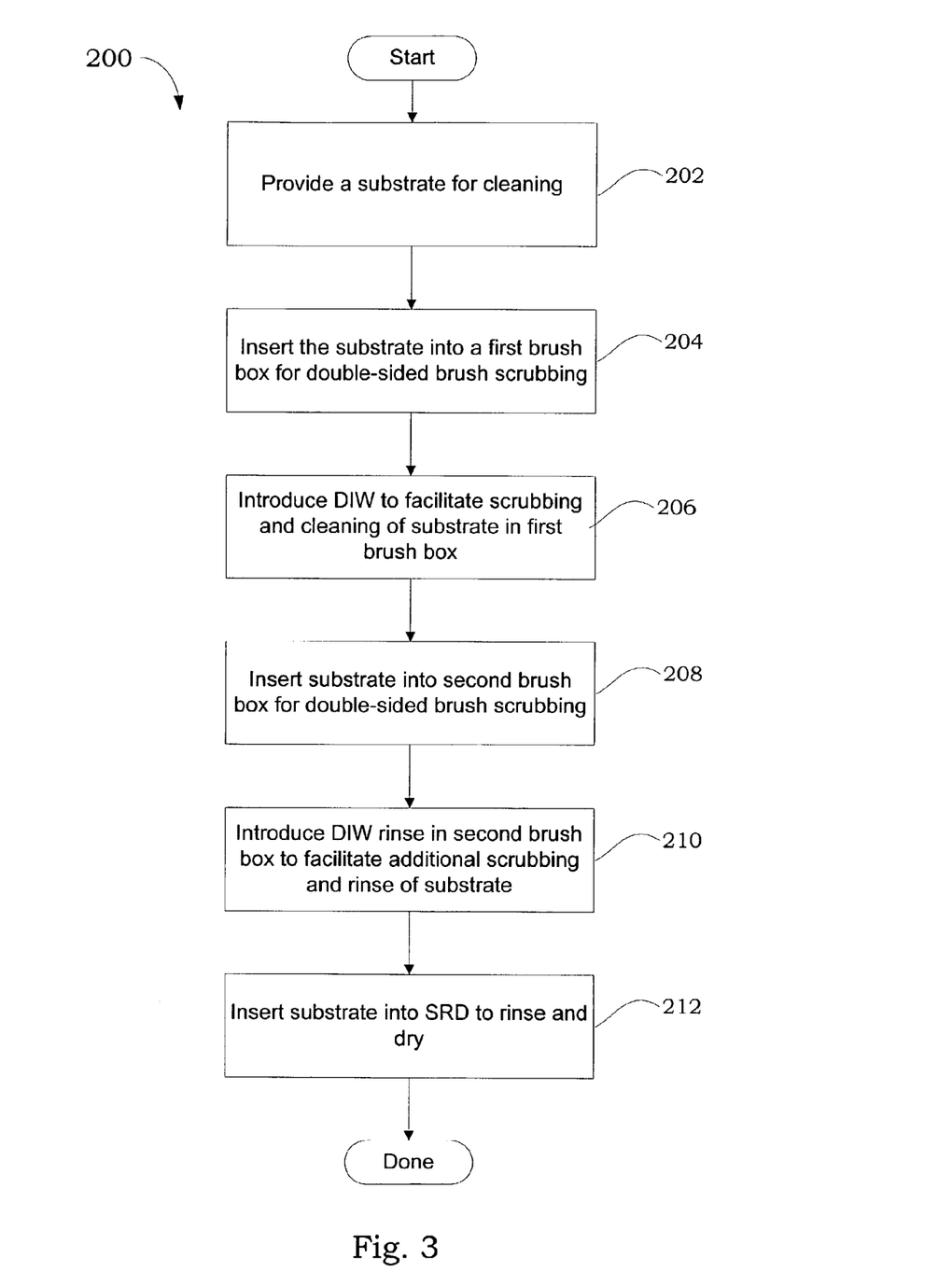
FIG. 3 is a flow chart diagram illustrating the method operations for chemical mechanical removal of post etch residues on MRAM structures in accordance with another embodiment of the present invention.

FIG. 3 is a flow chart diagram 200 illustrating the method operations for chemical mechanical removal of post etch residues on MRAM structures in accordance with another embodiment of the present invention. The method begins with operation 202 in which a substrate is provided for post-etch cleaning. In one embodiment, the substrate is a wafer having a low-k dielectric substrate having MRAM structures and materials with features etched therein. MRAM structures and materials include MJT structures and materials, and the features etched therein present a topography that is generally not uniformly smooth and planar.

The method continues with operation 204 in which the substrate is inserted into a first brush box for double-sided scrubbing. Double-sided scrubbing includes the mechanical cleaning of both the active and the backside surfaces of the substrate. The brush box can be any type of brush box scrubber typically used in semiconductor manufacturing. Exemplary brush box scrubbers include the brush box described in U.S. Pat. No. 5,875,507, and the brush box described in co-pending U.S. patent application Ser. No. 10/185,306, filed on Jun. 27, 2002, and assigned to the same assignee as the present application. The brush box scrubber can be of a type configured to process a substrate in a vertical orientation, in a horizontal orientation, or any other orientation in accordance with the particular brush box used. Chemistries, rinsing agents, or other fluids can be introduced through the brushes, against the substrate surfaces, over the brush surfaces, or in any other manner compatible and consistent with the brush box used. In one embodiment, the substrates are introduced into the first brush box by way of an input station that provides rinsing or wetting of a substrate prior to insertion into the first brush box scrubber. In another embodiment, a "dry" input station is used without a dedicated pre-scrub rinsing or wetting process.

The method continues with operation 106 in which deionized water (DIW) is introduced for double-sided brush scrubbing in the first brush box. In one embodiment, the DIW can have ammonium hydroxide and citric acid added as a cleaning agent. DIW can be introduced through the brush, against the wafer surfaces, over the brush, and/or in any manner compatible and consistent with the type of brushes and brush box used. The introduction of DIW into the first brush box for double-sided brush scrubbing can be immediately prior to and during double-sided brush scrubbing of the substrate, or in any manner compatible and consistent with the brush box used. In one embodiment, DIW is introduced into the first brush box for double-sided brush scrubbing at a flow rate of not less than 500 ml/min. In one embodiment, DIW is introduced into the first brush box for double-sided brush scrubbing at a flow rate of approximately 2 liters/min.

In one embodiment, the substrate is rotated during double-sided brush scrubbing in a range of approximately 10 RPM to approximately 200 RPM. In one embodiment, the substrate is rotated during double-sided brush scrubbing at approximately 20 RPM.

In one embodiment of the invention, as the DIW is introduced for and during double-sided brush scrubbing of the substrate, the brushes are rotated and applied against both the active and backside surfaces of the substrate. The resulting DIW rinse assisted mechanical cleaning of the substrate removes post-etch sidewall residues, polymers, particles, etc., from the etched MRAM features. In one embodiment, the brushes used are standard PVA brushes having nodules. The brushes are applied against the active and backside surfaces of the substrate at a pressure sufficient to achieve a brush compression in the range of approximately 1–5 mm.

In one embodiment, the brushes are rotated at a rotation rate in the range of approximately 10 RPM to approximately 400 RPM. In one embodiment, the brushes are rotated at approximately 120 RPM while scrubbing the substrate in the first brush box. In one embodiment, the substrate is scrubbed in the first brush box for a duration in the range of approximately 20 seconds to approximately 80 seconds. In one embodiment, the substrate is scrubbed in the first brush box for approximately 40 seconds.

Following the first DIW rinse assisted double-sided brush scrubbing in the first brush box of operation 206, the method continues with operation 208 in which the substrate is inserted into a second brush box for double-sided brush scrubbing. The second brush box, in one embodiment, is essentially of the same type and structure as the first brush box. In one embodiment, the substrate is processed through only a single brush box.

In operation 210, DIW is again introduced in essentially the same manner as described above in reference to operation 206 and the first DIW rinse assisted scrub. DIW is applied through the brushes, over the brushes, over the brushes and against the surfaces of the substrate, or in any other manner consistent and compatible with the brush box used. In one embodiment, DIW is introduced at not less than 500 ml/min. In one embodiment, DIW is introduced at approximately two liters/min.

In one embodiment, the substrate is scrubbed with a DIW rinse in operation 210 in essentially the same manner as described above for operation 206. The brushes are, in one embodiment, standard PVA brushes with nodules, applied against the active and backside surfaces of the substrate at sufficient pressure to achieve a brush compression of approximately 1–5 mm, and rotating at a rate in a range of approximately 10 RPM to approximately 400 RPM, and in one embodiment at approximately 120 RPM. In one embodiment, the substrate is rotated at a rate in a range of approximately 10–200 RPM, and in one embodiment the substrate is rotated at approximately 20 RPM. In one embodiment, the DIW rinse assisted scrubbing of the substrate in the second brush box is for a duration in a range of approximately 20 seconds to approximately 80 seconds, and in one embodiment for approximately 40 seconds.

The method concludes with operation 212 in which the substrate is inserted into a spin-rinse-dry (SRD) apparatus for final rinsing and drying following the second brush box scrubbing. The SRD apparatus can be any type of SRD apparatus commonly used in semiconductor manufacturing. Exemplary SRD apparatus include the SRD apparatus described in U.S. Pat. No. 5,778,554, and an SRD apparatus using a surface tension reducing process as described in co-pending U.S. patent application Ser. No. 10/151,664, filed on May 17, 2002, and assigned to the same assignee as the present application. In one embodiment, the substrate is processed through a drying apparatus other than an SRD apparatus. With the final rinse and dry of the substrate in operation 114, the method is done.

Although the three methods illustrated and described in FIGS. 1, 2, and 3, use a dual brush box configuration, i.e., a substrate is processed through a first brush box and a second brush box, it should be well understood by anyone skilled in the art that only one brush box could be used to perform all cleaning and rinsing operations.

In summary, embodiments of the present invention provide methods and processes for safe and effective post-etch cleaning of MRAM structures having MTJ structures and materials, as well as being safe and effective for delicate or fragile low-k dielectric structures. Because the etching of MRAM structures produce undesirable non-volatile residues, as well as other polymers or particles that remain following an etching operation, the delicate structures require effective cleaning prior to a next process step. Typical wet bench cleaning is inappropriate due to the material properties of the MRAM and MTJ structures and materials, and rinsing alone has proven ineffective. Embodiments of the present invention provide chemically assisted mechanical cleaning that effectively removes PR and other residues remaining on etched sidewall and other features, and removes the undesirable residues without damaging topography or a low-k dielectric substrate. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

What is claimed is:

1. A method for post-etch cleaning of a substrate having magnetic random access memory (MRAM) structures defined therein, the method comprising:
    providing a substrate having MRAM structures being fabricated thereon, the MRAM structures including copper wiring end multiple-tunnel junction (MTJ) structures and materials;
    inserting the substrate into a first brush box, the first brush box being configured to provide double-sided mechanical cleaning of an active and a backside surface of the substrate;
    applying a first brush against the active surface of the substrate and applying a second brush against the backside surface of the substrate, the first brush and the second brush being PVA brushes having nodules and being applied at a pressure to achieve brush compression between approximately 1–5 mm;
    introducing a copper compatible chemistry into the first brush box for cleaning the active and backside surfaces of the substrate;
    inserting the substrate into a second brush box, the second brush box being configured to provide double-sided mechanical cleaning of the active and backside surfaces of the substrate;
    applying a first brush of the second brush box against the active surface of the substrate and applying a second brush of the second brush box against the backside surface of the substrate, the first brush of the second brush box and the second brush of the second brush box being PVA brushes having nodules, and being applied at a pressure to achieve a brush compression between approximately 1 and 5 mm;
    introducing a burst of chemistry into the second brush box; and introducing a deionized water (DIW) rinse into the second brush box, wherein the copper compatible chemistry is ammonia based buffered solution containing chelating agent.

2. The method of claim 1, further comprising:
    inserting the substrate into a spin-rinse-dry (SRD) apparatus for final rinse and dry of the substrate.

3. The method of claim 1, wherein the substrate is rotated in the first and the second brush boxes at a rotation rate of approximately 10 RPM to approximately 200 RPM.

4. The method of claim 1, wherein the substrate is rotated in the first and the second brush boxes at a rotation rate of approximately 20 RPM.

5. The method of claim 1, wherein the first and second brushes in the first brush box and the first and second brushes of the second brush box are rotated at a rotation rate of approximately 10 RPM to approximately 400 RPM.

6. The method of claim 1, wherein the first and second brushes in the first brush box and the first and second brushes of the second brush box are rotated at a rotation rate of approximately 120 RPM.

7. The method of claim 1, wherein the copper compatible chemistry is introduce into the first brush box at a flow rate of approximately 100 to approximately 1000 ml/min.

8. The method of claim 1, wherein the cleaning the active and backside surfaces of the substrate in the first brush box is for a period of approximately 20 to 80 seconds.

9. The method of claim 1, wherein the cleaning the active and backside surfaces of the substrate in the first brush box is for a period of approximately 40 seconds.

10. The method of claim 1, wherein the DIW rinse includes a mixture of DIW and one of citric acid and ammonium hydroxide.

11. The method of claim 1, wherein the DIW rinse is introduced at a flow rate of not less than 500 ml/min.

12. The method of claim 11, wherein the DIW rinse is introduced at the flow rate of 2 liters/min.

13. A method for chemically assisted mechanical cleaning of magnetic random access memory (MRAM) structures, the method comprising:
    providing a substrate having MRAM structures being fabricated thereon, the MRAM structures including copper wiring and multiple-tunnel junction (MTJ) structures and materials, and the substrate having an active surface and a backside surface;
    inserting the substrate into a first brush box having a pair of brushes to provide double-sided mechanical cleaning of the active and backside surfaces of the substrate;
    introducing a copper compatible chemistry into the first brush box for cleaning the active and backside surfaces of the substrate the copper compatible chemistry is ammonia based buffered solution containing chelating agent;
    inserting the substrate into a second brush box having a pair of brushes to provide double-sided mechanical cleaning of the active and backside surfaces of the substrate; and
    introducing a deionized water (DIW) rinse into the second brush box,
    wherein each of the pair of brushes in the first brush box and in the second brush box is a PVA brush having nodules, and each of the pair of brushes being applied against the active and the backside surfaces of the substrate at a pressure to achieve a brush compression of between approximately 1 and 5 mm.

14. The method of claim 13, wherein the copper compatible chemistry is introduced into the first brush box at a flow rate of between approximately 100 and 1000 ml/min, and the DIW rinse is introduced into the second brush box at a flow rate of not less than 500 ml/min.

15. A method for post-etch cleaning of a substrate having magnetic random access memory (MRAM) structures defined therein, the method comprising:

providing a substrate having MRAM structures being fabricated thereon, the MRAM structures including copper wiring and multiple-tunnel junction (MTJ) structures and materials;

inserting the substrate into a brush box, the brush box being configured to provide double-sided mechanical cleaning of an active and a backside surface of the substrate;

applying a first brush against the active surface of the substrate and applying a second brush against the backside surface of the substrate, the first brush and the second brush being PVA brushes having nodules and being applied at a pressure to achieve brush compression between approximately 1–5 mm;

introducing a copper compatible chemistry into the first brush box for cleaning the active and backside surfaces of the substrate; and     inserting the substrate into a drying apparatus for final rinse and dry of the substrate, wherein the copper compatible chemistry is ammonia based buffered solution containing chelating agent.

\* \* \* \* \*